(12) United States Patent
Rodgers et al.

(10) Patent No.: US 6,769,104 B2
(45) Date of Patent: Jul. 27, 2004

(54) METHOD AND APPARATUS FOR MINIMIZING CLOCK SKEW IN A BALANCED TREE WHEN INTERFACING TO AN UNBALANCED LOAD

(75) Inventors: Richard S. Rodgers, Fort Collins, CO (US); Scott T. Evans, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/140,704

(22) Filed: May 8, 2002

(65) Prior Publication Data

US 2003/0212971 A1 Nov. 13, 2003

(51) Int. Cl.[7] ............................................... G06F 17/50
(52) U.S. Cl. .................................. 716/6; 716/4; 716/5
(58) Field of Search ............................... 716/4–6, 8–10, 716/12–14; 327/295–296

(56) References Cited

U.S. PATENT DOCUMENTS

| | | | | |
|---|---|---|---|---|
| 5,109,168 A | * | 4/1992 | Rusu ............................. | 326/47 |
| 5,410,491 A | * | 4/1995 | Minami .......................... | 716/6 |
| 5,557,779 A | * | 9/1996 | Minami .......................... | 716/6 |
| 5,912,820 A | | 6/1999 | Kerzman et al. ............... | 716/6 |
| 5,926,397 A | * | 7/1999 | Yamanouchi .................. | 716/14 |
| 6,204,713 B1 | * | 3/2001 | Adams et al. ................. | 327/295 |
| 6,260,181 B1 | * | 7/2001 | Inoue ........................... | 716/10 |
| 6,311,313 B1 | * | 10/2001 | Camporese et al. ............ | 716/6 |
| 6,380,787 B1 | * | 4/2002 | Forbes ......................... | 327/292 |
| 6,440,780 B1 | * | 8/2002 | Kimura et al. ............... | 438/129 |
| 6,473,890 B1 | * | 10/2002 | Yasui et al. .................... | 716/10 |
| 6,513,149 B1 | * | 1/2003 | Donato ......................... | 716/12 |

OTHER PUBLICATIONS

Yip, K., "Clock tree distribution", Potentials, IEEE , vol.: 16, Issue: 2 , Apr.–May 1997 pp.:11–14.*
Afghahi et al. "Performance of Synchronous and Asynchronous Schemes for VLSI Systems", IEEE Transactions on Computer, vol. 41, No. 7, Jul. 1992, pp. 858–872.*
Lockyear et al. "Optimal Retiming of Level–Clocked Circuits Using Symmetric Clock Schedules", IEEE Transactions on Computer–Aided Design of Integrated Circuits and Systems, vol. 13, No. 9, Sep. 1994, pp. 1097–1109.*
Andrew et al. "Design of Synchronous Circuits with Multiple Clocks", 1995 IEEE International Symposium on Circuits and Systems, vol. 2, Apr. 28, 1995, pp. 933–936.*
Jackson et al., "Clock–Routing for High–Performance ICs", ACM/IEEE Design Automation Conference, Jun. 24, 1990, pp. 573–579.*
Boon et al., "High Performance Clock Distribution for CMOS ASICs", IEEE Custom Integrated Circuits Conference, 1989, pp. 15.4.1–15.4.5.*

* cited by examiner

*Primary Examiner*—Vuthe Siek
*Assistant Examiner*—Naum Levin

(57) ABSTRACT

A method for minimizing clock skew in a balanced tree when interfacing to an unbalanced load is presented. Unused portions of the balanced tree are replaced by a loading equivalent circuit to create a physically balanced load. In the preferred embodiment, the loading equivalent circuit is implemented with a single-pole resistor-capacitor circuit that has been modeled to match the RC characteristics of the replaced branch of the tree.

10 Claims, 7 Drawing Sheets

METHOD AND APPARATUS FOR MINIMIZING CLOCK SKEW IN A BALANCED TREE WHEN INTERFACING TO AN UNBALANCED LOAD

FIELD OF THE INVENTION

The present invention pertains generally to integrated circuits, and more particularly, to a method and apparatus for minimizing clock skew in a balanced tree when interfacing to an unbalanced load.

BACKGROUND OF THE INVENTION

Clock networks on CMOS integrated circuits have long been a source of difficulty to integrated circuit designers due to the importance of minimizing skew between clock inputs. A typical integrated circuit includes a clock tree which distributes one or more clock signals throughout the chip to clocked elements. A primary goal of a clock tree is to minimize clock skew between clocked elements. Since all clocked elements are driven from one net with a clock spine, skew is caused by differing interconnect lengths and loads. If the delay is much larger than the interconnect delays, a clock spine achieves minimum skew but with long latency. Clock skew represents a fraction of the clock period that cannot be used for computation. A clock skew of 500 ps with a 200 MHz clock means that 500 ps of every 5 ns clock cycle, or 10 percent of the performance is wasted. That is, clock skew may reduce the time allowed for certain logic paths within the design, and thus may reduce the performance of the design. Thus, for high performance designs that have strict timing requirements, it is often critical to minimize clock skew.

To minimize clock skew, typical clock trees include a number of clock drivers that are symmetrically and evenly placed on the integrated circuit die. In order to reduce clock skew in a clock tree, it is important to balance the delays through the tree carefully to minimize clock skew. There may be a number of first level drivers, which may receive a clock signal from an input buffer, and may be placed near the center of the integrated circuit. Each of the first level drivers may drive a number of second level drivers. Typically, each of the first level drivers will drive the same number of second level drivers. This is intended to maintain a matched load therebetween. The number of second level drivers may be symmetrically and evenly placed on the integrated circuit die.

A typical clock tree may include a number of levels of clock drivers. The number of clock drivers in the last level is typically sufficient to drive all of the clock loads within the design. Like all other levels, the last level of clock drivers is typically placed symmetrically and evenly throughout the integrated circuit die.

In many cases, all of the clock drivers are pre-placed on the integrated circuit die. This allows the clock drivers to be placed at any desired location on the integrated circuit die. This allows the clock tree to be evenly distributed and balanced. The routing between clock drivers may also be pre-placed and balanced.

Designing and constructing a balanced clock tree is often a time-consuming task, requiring significant design resources. Therefore, it is common for only one "worst case" clock tree to be designed. The "worst case" clock tree may then be used in each integrated circuit within a system, while still maintaining an acceptable clock skew.

After the "worst case" clock tree is designed and preplaced, the circuit designer may use a placement tool to manually place selected regions or cell of the circuit design. Thereafter, an automatic place and route tool may be used to place the remaining cells, and route the design according to the overall design specifications.

The above clock tree generating scheme has a number of limitations, some of which are described below. First, each of the clock drivers in the last level of the clock tree may have a limited drive capability, and thus may only drive a limited number of clock loads (e.g. registers, flip-flops, etc.). To use the same clock tree for multiple integrated circuit designs, and as described above, the clock tree may have to be designed to accommodate the number of clock loads in the "worst case" integrated circuit design. Because the same 'worst case' clock tree may be used for all integrated circuits within the system, many of the integrated circuits may be populated with more clock drivers than are actually required. This is especially limiting when the number of clock drivers that are required varies dramatically between circuit designs. These extra clock drivers may consume die area and power that could otherwise be used to implement the logical design.

FIG. 1 is a diagram illustrating a reduction in the effective clock period between registers caused by clock skew. An illustrative timing path is shown at 10, and a timing diagram therefore is shown at 30. The timing path includes a first rising edge triggered register 22a receiving data $D_a$ from a first input/output pad 20a, and a second rising edge triggered register 22b receiving data $D_b$ from a first input/output pad 20a. The first register 22a is clocked by a first clock signal $CLK_a$ and the second register 22b is clocked by a second clock signal $CLK_b$.

With reference to the timing diagram 30, the input clock CLK is shown at 24. The first clock signal $CLK_a$ and the second clock signal $CLK_b$ are generated from the input clock signal CLK 24 via a clock tree or the like. The timing diagram 30 shows that the first clock signal $CLK_a$ is skewed relative to the second clock signal $CLK_b$, as shown by $t_{skew}$. This clock skew $t_{skew}$ may be caused by an improperly designed clock tree.

On the rising edge of the first clock signal $CLK_a$, the first register 22a may release data $Q_a$ via the logic-in signal $D_a$. On the rising edge of the second clock signal $CLK_b$, the second register 22b may release data $Q_b$ via the logic-in signal $D_a$. When the subsequent logic (not shown) is designed to receive and use the latched data $Q_a$ and $Q_b$ simultaneously, the clock skew $t_{skew}$ is clearly problematic.

Because of the clock skew $t_{skew}$ between the first and second clock signals $CLK_a$ and $CLK_b$, the effective clock period $T_{eff}$ between the rising edge of the first clock signal $CLK_a$ and the subsequent rising edge of the second clock signal $CLK_b$ is less than the clock period $T_{period}$, this effectively reduces the time allowed for the data to pass through subsequent logic before receiving the next incoming data, and thus may reduce the performance of the logic path.

For the above reasons, a primary goal of a clock tree is to minimize clock skew between clocked elements. As shown above, clock skew may reduce the effective clock period for certain logic paths within the design, and thus may reduce the performance of the design. For high performance designs that have strict timing requirements, clock skew may consume a substantial portion of the total clock period.

Clock skew may have a number of other detrimental effects on the performance of a circuit design, only some of which are described below. For example, clock skew may cause hold time violations when only a small amount of logic is provided between registers. Further, clock skew may cause communication problems between integrated circuits. It should be recognized that these are only illustrative examples of effects that clock skew may have on a system.

FIG. 2 is a schematic diagram illustrating a typical prior art clock tree. As indicated above, each integrated circuit typically includes a clock tree. The clock tree may distribute one or more clock signals throughout the design. As indicated above, a primary goal of a clock tree is to minimize clock skew between clocked elements.

Referring to FIG. 2, balanced clock trees include a number of clock drivers that are symmetrically and evenly placed on the integrated circuit die. An integrated circuit die is generally shown at 50. There may be a number of first level drivers 55, which may receive a clock signal from an input buffer (not shown), and may be placed near the center of the integrated circuit. Each of the first level drivers may drive a number of second level drivers 56. Typically, each of the first level drivers 55 drives the same number of second level drivers 56 as all other first level drivers. This may maintain a load match therebetween. The number of second level drivers may be symmetrically and evenly placed on the integrated circuit die, as shown. Symmetrical placement is typically used to distribute the clock signal evenly throughout the design to minimize clock skew between clocked elements.

Although the illustrative embodiment shown in FIG. 2 only shows two levels of clock drivers, it is recognized that a typical clock tree may include a number of levels of clock drivers, such that the number of clock drivers in the last level is sufficient to drive all of the clock loads within the design. Like the other levels, the clock drivers in the last level are typically placed symmetrically and evenly throughout the integrated circuit die.

In many cases, all of the dock drivers are pre-placed on the integrated circuit die prior to placement of functional logic blocks. For example, the first level clock drivers 55 and the second level clock drivers (e.g. clock driver 56) may be pre-placed on the integrated circuit die. This may allow the clock drivers to be placed at any desired location on the integrated circuit die, without having to be concerned with avoiding the placement locations of other cells. This may allow the clock tree to be evenly distributed and balanced. The routing between clock drivers may also be pre-placed and balanced.

For the integrated circuit shown at 50, a functional logic block 60 may be placed in the lower-right quadrant, as shown. The functional logic block 60 may not provide any clock loads to the clock tree, as it may be an asynchronous device. Thus, for the clock tree scheme shown in FIG. 2, all of the second level clock drivers that are pre-placed in the lower-right quadrant 54 of the integrated circuit die 50 may not be required, and the die area and power consumed by those clock drivers may be wasted.

Second, and because the clock tree shown is symmetrically and evenly distributed throughout the integrated circuit die 50, the circuit designer typically must consider the number of clock loads that are placed in a given region.

As process generations have advanced, the contributions of resistance and capacitance in clock tree routing have becomes a significant portion of the overall clock skew. Without a well designed balanced clock tree, designers have to allocate a larger percentage of the chip real estate budget allocation for the dock tree to uncertainty and mismatch of clock edge arrival.

Designing a balanced clock tree is problematic when faced with the physical constraints of the integrated circuit. The actual physical layout often presents an unbalanced set of clock inputs (an unbalanced load) to the balanced clock tree. This can result in an undesirable increase in clock skew between branches of the clock tree.

The problem of unbalanced loading of dock inputs has been solved previously by physically duplicating the metal muting of a used clock branch in a branch without clock inputs. This technique reduces clock skew by creating a balanced load network to present to the clock tree. Unfortunately, this technique consumes additional routing resources, adds complexity to the physical artwork layout, and is limited in application to areas of the integrated circuit where space is available.

SUMMARY OF THE INVENTION

The present invention is a method and apparatus for minimizing clock skew in a balanced tree when interfacing to an unbalanced load. The present invention solves the physical limitations and drawbacks of the prior art by creating a physically balanced load, preferably with a loading equivalent circuit comprising an RC circuit that has been modeled to match the performance of the actual metal route. The loading equivalent circuit enables the designer to minimize clock skew by tuning the circuit after the clock tree has been designed.

The loading equivalent circuit of the invention can effectively reduce clock skew even with imprecise matching of the actual clock branch. Simulations reveal even 20 percent variations in component values do not compromise the significant improvements to the clock skew when the loading equivalent circuit is used in a clock tree.

The loading equivalent circuit of the invention can be used in space limited clock routing without consuming significant routing resources or adding unnecessary complexity. The loading equivalent circuit can be built on the integrated circuit from a resistance and capacitance network. This network can be formed from a combination of metal traces and parasitic capacitances, poly resistors and poly capacitors, or FETs.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and circuit for minimizing clock skew in a balanced tree when interfacing to an unbalanced load is described in detail hereinafter. Although the invention is described in terms of specific illustrative embodiments, it is to be understood that the embodiments described herein are by way of example only and that the scope of the invention is not intended to be limited thereby.

Figure 3:
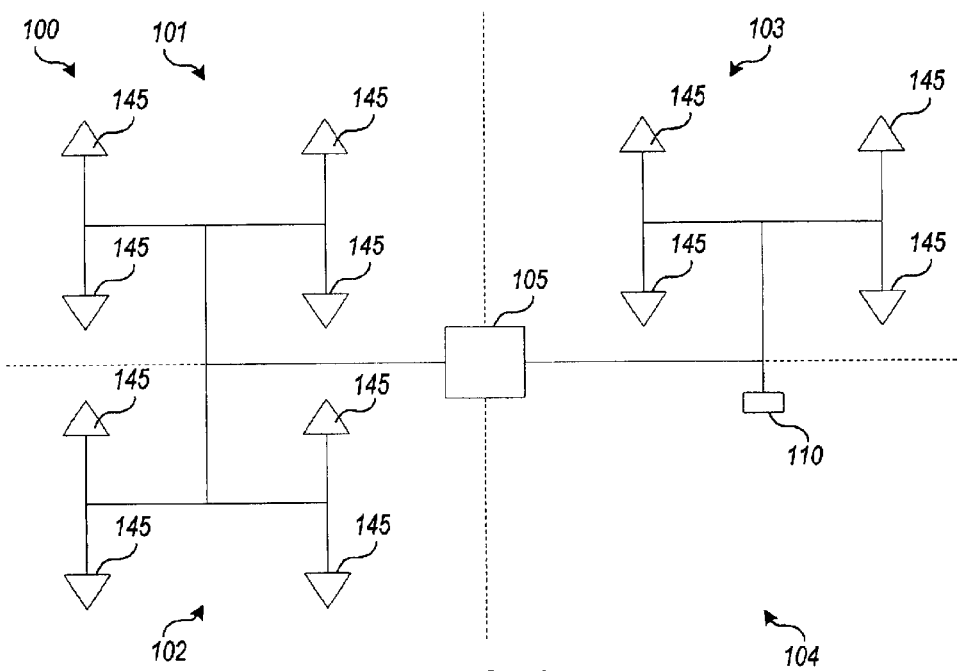
FIG. 3 is a diagram illustrating a schematic block routing diagram of a clock tree implemented in accordance with the principles of the invention.

Turning now to the invention, FIG. 3 is a schematic block routing diagram of a clock tree, shown at 100, implemented in accordance with the principles of the invention. As shown therein, the tree 100 is balanced across three quadrants 101, 102, 103. In this regard, the tree 100 implements a number of clock drivers 145 that are symmetrically and evenly placed across the three quadrants 101, 102, 103 of the integrated circuit die. The clock tree 100 includes a number of first level drivers 105, which may receive a clock signal from an input buffer (not shown), and may be placed near the center of the integrated circuit. Each of the first level drivers 105 may drive a number of second level drivers 145. Preferably, each of the first level drivers 105 drives the same number of second level drivers 145 as all other first level drivers in order to maintain a load match therebetween. The number of second level drivers 145 are symmetrically and evenly placed in the three clocked quadrants 101, 102, 103 of the integrated circuit die, as shown.

Although the illustrative embodiment shown in FIG. 3 only shows two levels of clock drivers, it will be appreciated by those skilled in the art that a clock tree implemented in accordance with the principles of the invention may include any number of levels of clock drivers, such that the number of clock drivers in the last level is sufficient to drive all of the clock loads within the design. Like the other levels, the clock drivers in the last level are typically placed symmetrically and evenly throughout the integrated circuit die.

The clock tree 100 of the invention includes a fourth quadrant 104 which does not provide clock drivers. For example, quadrant 104 may be used for asynchronous functional logic that does not require a clock signal. In order to match the load of each other branch of the otherwise balanced clock tree, according to the invention, a loading equivalent circuit 110 is implemented in place of the symmetric branch of the clock tree.

The loading equivalent circuit 110 comprises a circuit that models and matches the properties of the unused clock tree branch that it replaces. In the preferred embodiment, the loading equivalent circuit 110 is a lumped resistor-capacitor network implemented in place of the missing branch but implemented to consume a very small amount of chip space. This allows the clock tree to operate as a balanced tree, having the same effect as if all RC clock tree paths existed, but without actually implementing the unneeded branch. It also allows unclocked functional logic to be implemented in the space that would otherwise have been occupied and consumed by the "dummy" clock branch, thereby increasing the amount of chip real estate available for functional logic.

Figure 1:
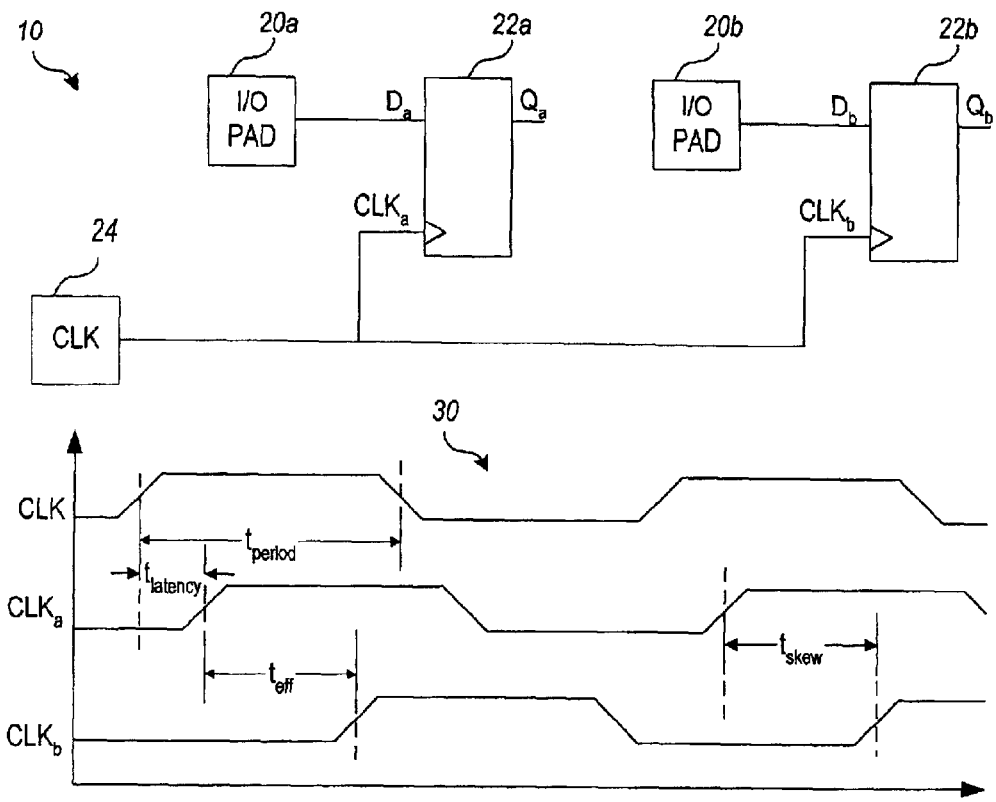
FIG. 1 is a timing diagram illustrating a reduction in the effective clock period between registers caused by clock skew.
Figure 4:
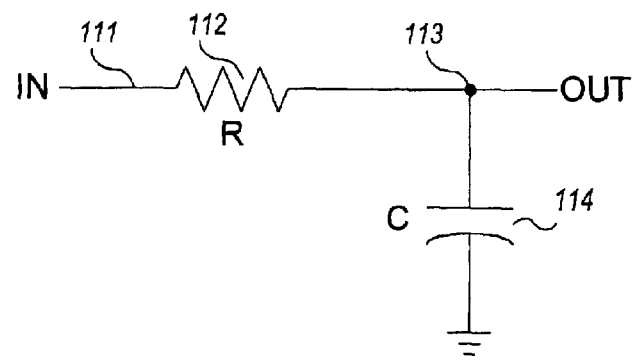
FIG. 4 is a schematic diagram of a preferred embodiment of a loading equivalent circuit.
Figure 2:
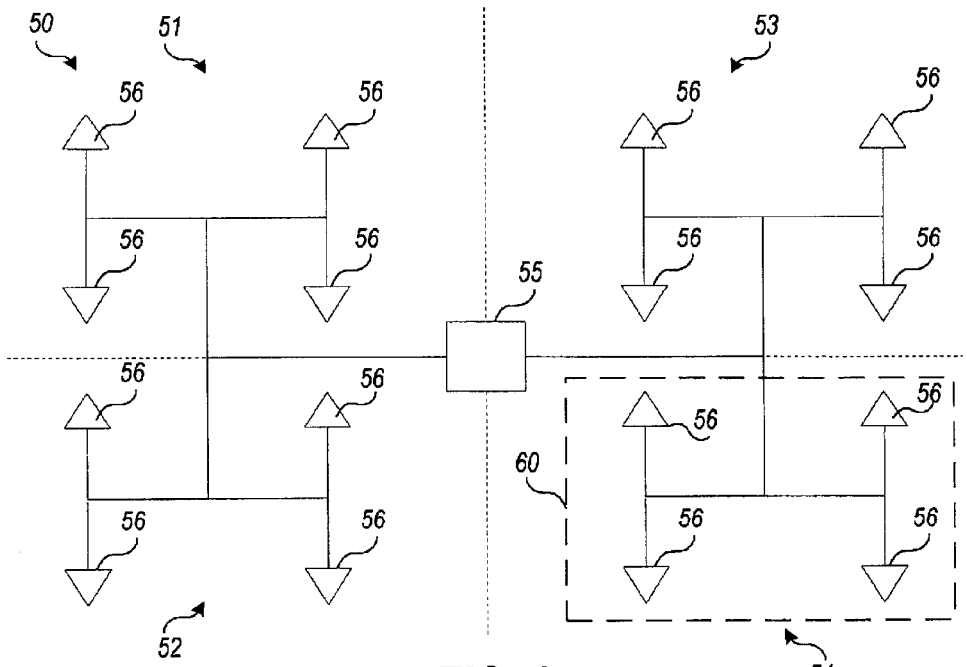
FIG. 2 is a diagram illustrating a schematic block routing diagram of a prior art balanced clock tree.

FIG. 4 is a schematic diagram of a preferred embodiment of the loading equivalent circuit 110 of the invention. As illustrated, the loading equivalent circuit 110 is a single-pole RC circuit including a resistor 112 and a capacitor 114 connected in parallel therewith. The values chosen for the resistor 112 and capacitor 114 are designed to match the RC characteristics of the "dummy" branch.

It will be appreciated that a simple single-pole RC circuit occupies far less chip space than a "dummy" clock tree branch. It also allows the designer to lay out clock tree in the floorplanning stage as functionally efficient as possible, and then add the loading equivalent circuits with matching RC time constants thereafter. This significantly reduces the design time for creating the clock tree.

According to the invention, a mere single-pole lumped RC circuit can model the RC characteristics of a tree branch. This has not heretofore been done because single-pole RC circuits were not previously considered accurate enough to match the properties of a complex clock tree branch. However, according to the inventors' simulations, the use of a simple single-pole RC circuit have proven very successful. Of course, the design may allow for more accuracy by modeling and implementing higher-order RC circuits.

Figure 5A:
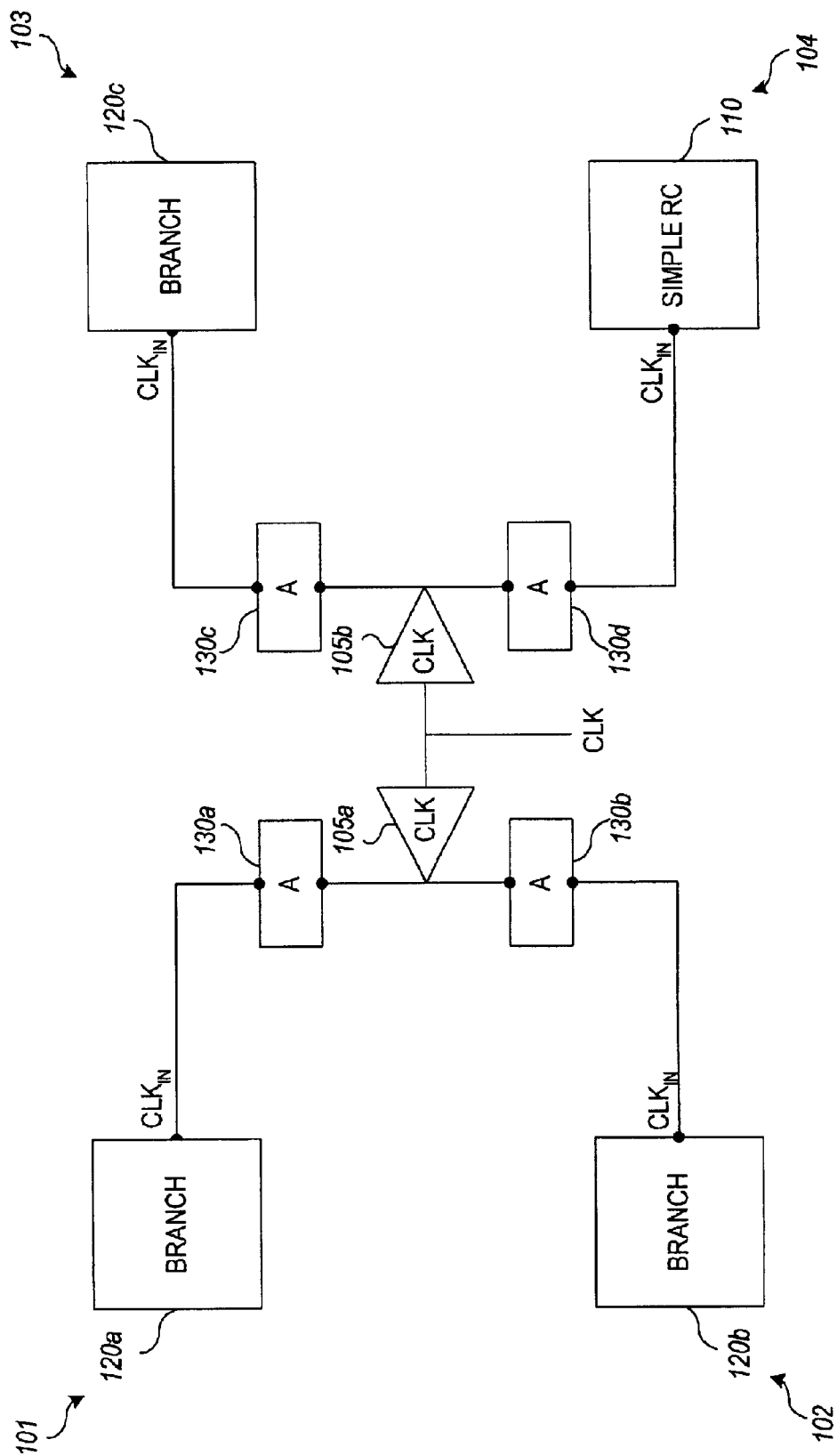
FIG. 5A is a first portion of a schematic block diagram of an illustrative embodiment of a clock routing tree implemented in accordance with the invention.

FIG. 5A is a first portion of a schematic block routing diagram for an illustrative embodiment of a clock tree implemented in accordance with the invention. As illustrated, the clock tree 100 includes first level clock drivers 105a, 105b, connecting to branches 120a, 120b, 120c of the tree and loading equivalent circuit 110 via respective interconnects 130a, 130b, 130c, and 130d. Each A interconnect 130a, 130b, 130c, 130d is equal in length, width, and thickness to each other A interconnect.

Figure 5B:
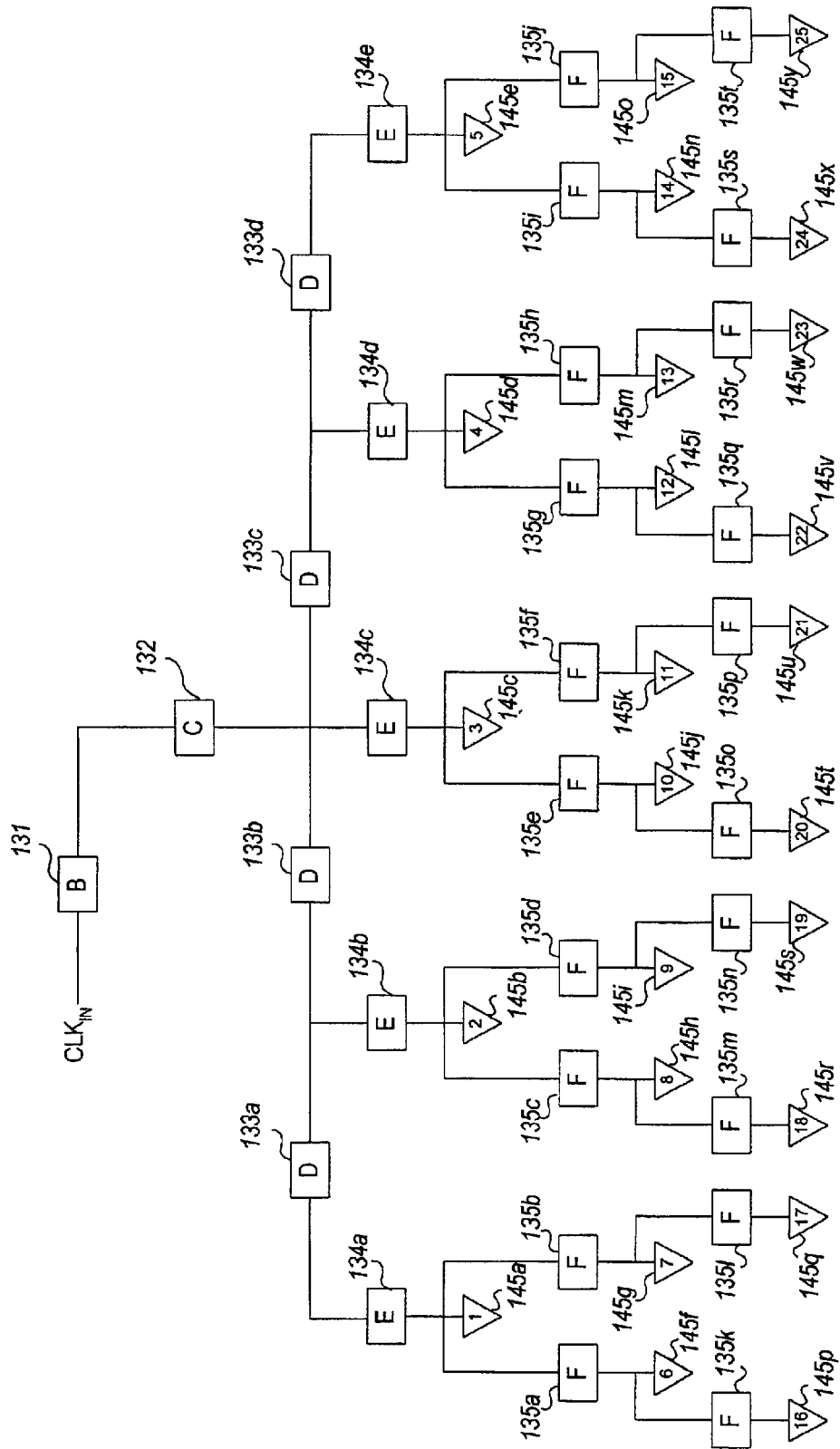
FIG. 5B is a second portion of a schematic block diagram of the clock routing tree of FIG. 5A.

Each branch 120a, 120b, 120c implements the clock tree branch 120 illustrated in FIG. 5B. As shown in FIG. 5B, the clock tree branch 120 comprises a plurality of second level drivers 145a–145y symmetrically laid out via interconnects B 131, C 132, D 133a–133d, E 134a–134d, and F 135a–135t. As also shown, because clock driver 3 145c lies on the shortest path from the first level clock driver 105 (following interconnect A 130, interconnect B 131, interconnect C 132, and interconnect E 134c), clock driver 3 145c is the first clock driver to receive the input clock signal CLK. In contrast, since clock driver 25 145y, for example, lies on the longest path from the first level clock driver 105 (following interconnect A 130, interconnect B 131, interconnect C 132, interconnect D 133c, interconnect D 133d, interconnect E 134e, interconnect F 135j, and interconnect F 135t), clock driver 25 145y is one of the last second level clock drivers to receive the input clock signal CLK. Accordingly, the clock skew between clock driver 3 145c and clock driver 25 145y must be minimized as much as possible. Current acceptable target skew goals are less than 200 picoseconds.

TABLE 1 lists the metal parameters for each of the interconnects for a preferred embodiment of the illustrative embodiment of FIGS. 5A and 5B to achieve a clock skew between clock driver 3 145c and clock driver 25 145y at less than 200 picoseconds.

TABLE 1

| Interconnect | Length (um) | Width (um) |
|---|---|---|
| A | 445 | 4 |
| B | 1125 | 3.75 |
| C | 15 | 1.50 |
| D | 350 | 3.75 |

TABLE 1-continued

| Interconnect | Length (um) | Width (um) |
|---|---|---|
| E | 75 | 1.95 |
| F | 175 | 1.50 |

Figure 6:
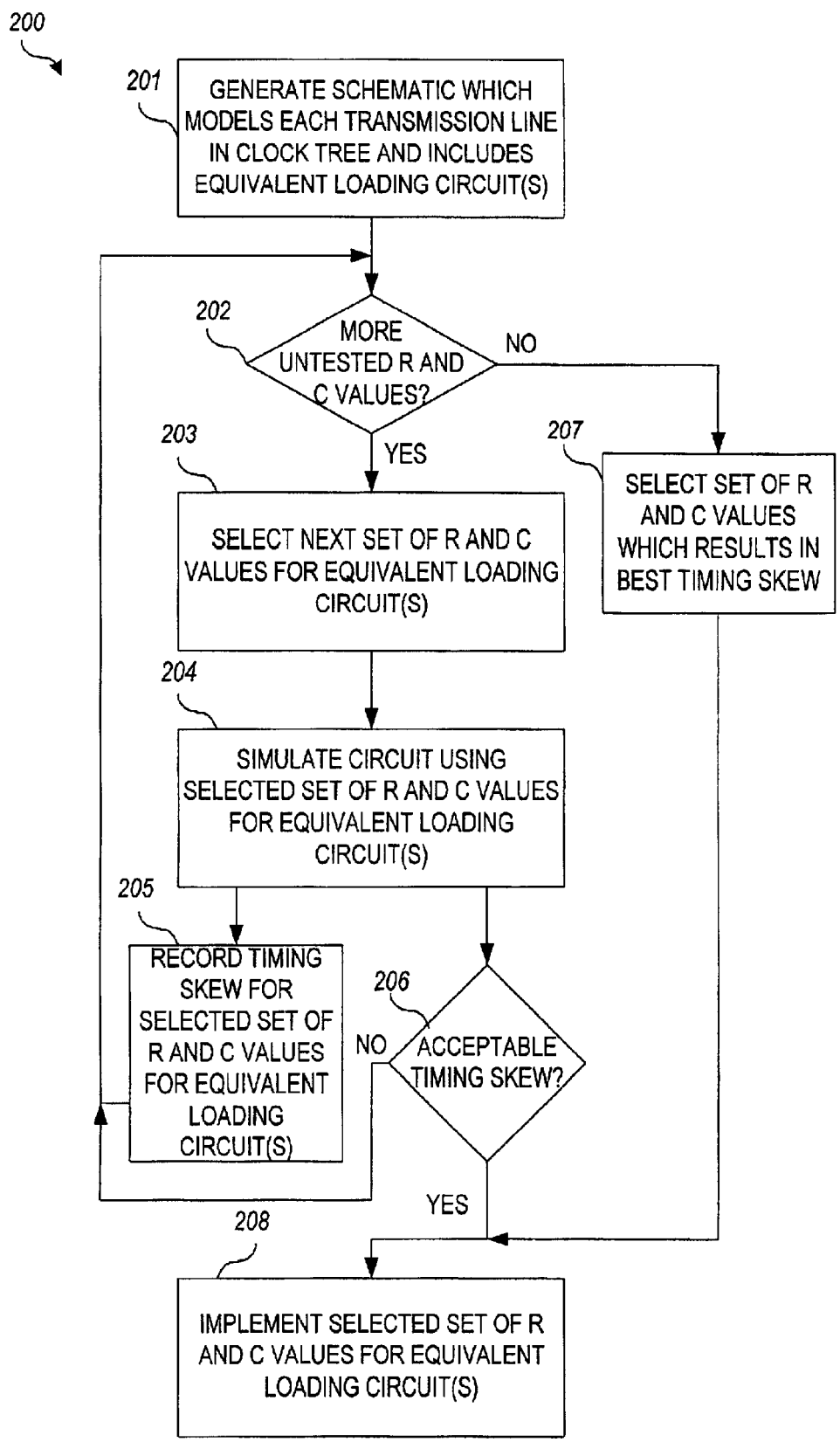
FIG. 6 is an operational flowchart of a preferred embodiment of a method for determining appropriate resistance and capacitance values for a loading equivalent circuit of the invention.

To determine the values R of the resistor 112 and C of the capacitor 114 of the single-pole RC circuit, in a preferred embodiment, the designer employs the method of FIG. 6. As illustrated therein, the method 200 sequences through the following set of steps: In a first step 201, a schematic diagram is generated modeling each of the transmission lines in the clock tree, and including the equivalent loading circuit 110 of the invention. In the preferred embodiment the equivalent loading circuit 110 is a single-pole RC circuit. In a second step 202, R and C values for the equivalent loading circuit 110 are evaluated 202 and selected 203. A simulation of the model circuit using the selected R and C values is run 204. Steps 202 through 204 are repeated until a set of R and C values are selected in step 206 which result in acceptable timing skew. The design is then implemented 208 with the selected set of R and C values in the equivalent loading circuit(s) 110.

In the alterative, the timing skew associated with the simulated R and C values are recorded in a step 205, and steps 202 through 205 are repeated until the timing skew associated with all available R and C values has been obtained. Once the timing skew associated with all available R and C values has been obtained, the set of R and C values which result in the best timing skew are selected 207 for implementation 208 of the equivalent loading circuit 110.

Referring back to FIGS. 5A and 5B, the unbalanced tree is represented by everything 120c, 130c, 110, 130d being driven by clock driver 105b. The balanced tree is represented by everything 120a, 130a, 120b, 130b being driven by clock driver 105a. The values in the simple RC loading equivalent circuit 110 are manipulated using the method of FIG. 6 in order to match the clock arrival time of clock receivers in 120c with those in 120a and 120b. In the present example, the goal is to as closely match clock driver 3 145c in 120c with clock driver 145c in 120a and 120b. This may be accomplished by sweeping the simple RC parameters and observing when the time mismatch between clock driver 3 145c in 120c with clock driver 145c in 120a and 120b is closest to zero. The process is repeated for clock driver 25 145y in 120c vs. clock driver 25 145y in 120a, 120b.

Figure 7:
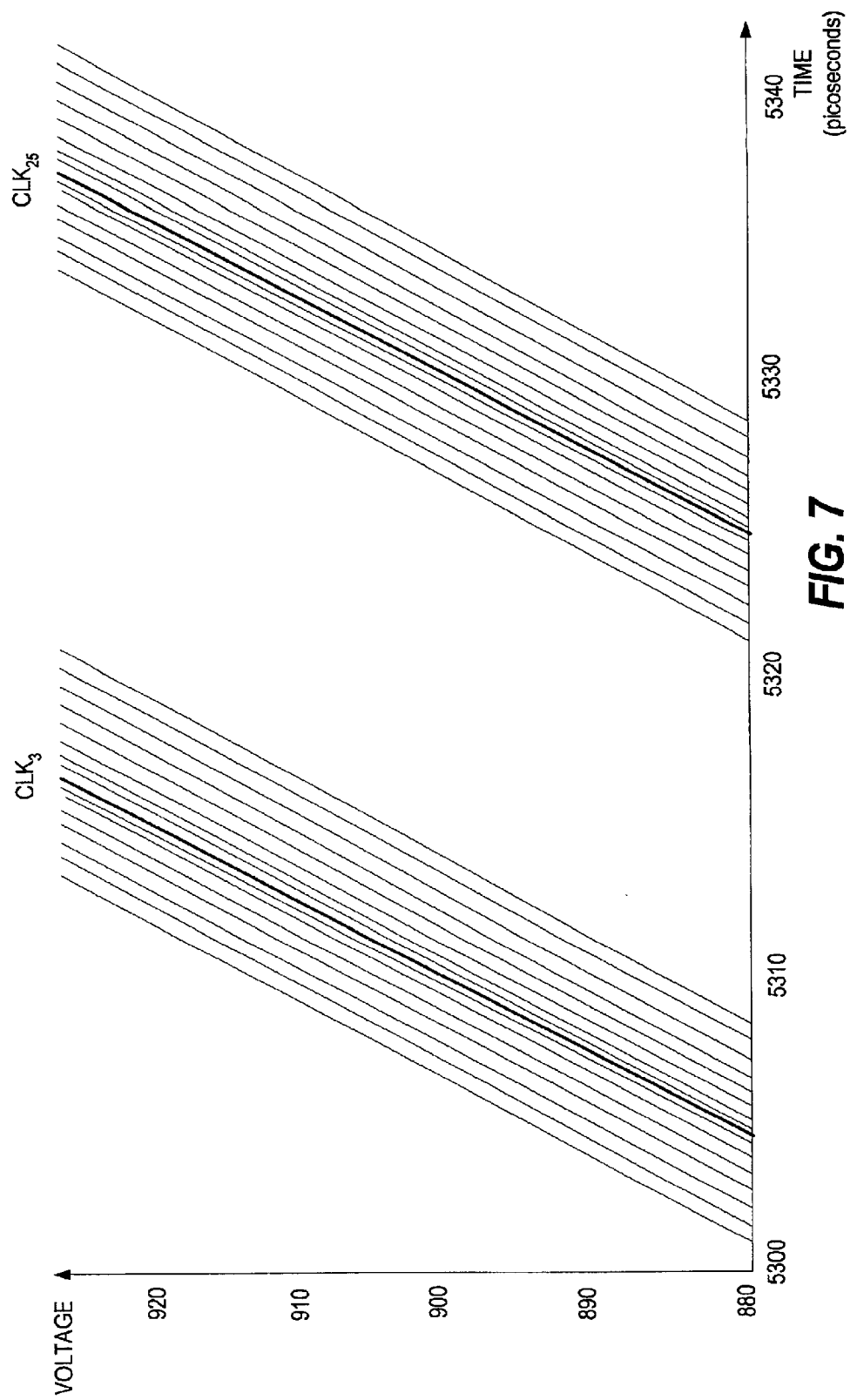
FIG. 7 is a graph of SPICE results comparing the clock arrival time at the clock receiver in both the balanced and unbalanced trees.

FIG. 7 is a zoomed-in view of the spice results comparing the clock arrival time at the clock receiver in both the balanced and unbalanced trees. More particularly, FIG. 7 is a timing diagram illustrating a SPICE sweep result for determining the capacitance value C for the single-pole RC loading equivalent circuit 110 of FIG. 5A using the method of FIG. 6. As known by those skilled in the art, SPICE allows the designer to input artwork parameters such as the width and length of an interconnect to extract a set of Rs and Cs for the interconnects of a balanced tree. Accordingly, once these are obtained, the designer can then break a branch of the tree and apply a single R and C at the broken point and sweep it in SPICE.

As described in conjunction with FIG. 5B, clock driver 3 145c is the first to receive the clock signal $CLK_{IN}$ in the balanced branch 120, and clock driver 25 145y is the last to receive the clock signal $CLK_{IN}$. Accordingly, the goal is to select a capacitance value C for the loading equivalent circuit 110 of FIG. 4 that results in the same (or as close to the same) clock skew between like clock pads in the balanced branch as in the unbalanced branch of the tree. Thus, as illustrated, the SPICE simulation example of FIG. 7 sweeps the capacitor value C in order to reduce the time mismatch between the arrival of the clock signal $CLK_{IN}$ at clock driver 3 145c and clock driver 25 145y. TABLE 2 lists the capacitance values tested for the sweep and the resulting time difference between clock driver 3 145c and clock driver 25 145y. As illustrated in both TABLE 2 and in FIG. 7, the time mismatch between the clock driver 3 145c and clock driver 25 145y is minimized when the capacitance value C is 2.200 pF.

TABLE 2

| Capacitance Value | Sweep # | Time mismatch ($CLKIN3_{BALANCED}$ - $CLKIN3_{UNBALANCED}$ at 0.5*VDD) |
|---|---|---|
| 1.500 pF | 1 | 2.996 p |
| 1.600 pF | 2 | 2.518 p |
| 1.700 pF | 3 | 2.064 p |
| 1.800 pF | 4 | 1.632 p |
| 1.900 pF | 5 | 1.221 p |
| 2.000 pF | 6 | 829.8 f |
| 2.100 pF | 7 | 456.1 f |
| 2.200 pF | 8 | 99.10 f |
| 2.300 pF | 9 | −242.4 f |
| 2.400 pF | 10 | −569.5 f |
| 2.500 pF | 11 | −883.0 f |
| 2.600 pF | 12 | −1.184 p |
| 2.700 pF | 13 | −1.473 p |
| 2.800 pF | 14 | −1.750 p |
| 2.900 pF | 15 | −2.018 p |
| 3.000 pF | 16 | −2.275 p |

In order to properly match the characteristics of the balanced tree, the capacitance value C must also be chosen to match the delay of when the last pad to receive the clock signal CLK. In FIG. 5B, the last pad to receive the is clock driver 25 145y. The delay time after which the clock drivers 145a–145y receive the input clock signal CLK depends upon the values of the resistor and capacitor in the loading equivalent circuit. Accordingly, the goal is to select a capacitance value C for the loading equivalent circuit 110 of FIG. 4 that results in the same (or as close to the same) clock skew between like clock pads in the balanced tree as in the unbalanced tree of the invention. TABLE 3 lists the capacitance values tested for the sweep and the resulting time difference between clock driver 25 145y and the input of the loading equivalent circuit 110. As illustrated in both TABLE 3 and in FIG. 7, the time mismatch between the clock driver 25 145y and the input of the loading equivalent circuit is minimized when the capacitance value C is 2.200 pF.

TABLE 3

| Capacitance Value | Sweep # | Time mismatch ($CLK_{IN}25_{BALANCED}$ - $CLK_{IN}25_{UNBALANCED}$ at 0.5*VDD) |
|---|---|---|
| 1.500 pF | 1 | 2.761 p |
| 1.600 pF | 2 | 2.342 p |
| 1.700 pF | 3 | 1.943 p |
| 1.800 pF | 4 | 1.562 p |
| 1.900 pF | 5 | 1.198 p |
| 2.000 pF | 6 | 850.2 f |
| 2.100 pF | 7 | 517.2 f |
| 2.200 pF | 8 | 198.0 f |
| 2.300 pF | 9 | −108.1 f |
| 2.400 pF | 10 | −402.0 f |

TABLE 3-continued

| Capacitance Value | Sweep # | Time mismatch (CLK$_{IN}$25$_{BALANCED}$ - CLK$_{IN}$25$_{UNBALANCED}$ at 0.5*VDD) |
|---|---|---|
| 2.500 pF | 11 | −684.3 f |
| 2.600 pF | 12 | −955.9 f |
| 2.700 pF | 13 | −1.217 p |
| 2.800 pF | 14 | −1.469 p |
| 2.900 pF | 15 | −1.712 p |
| 3.000 pF | 16 | −1.946 p |

Figure 8:
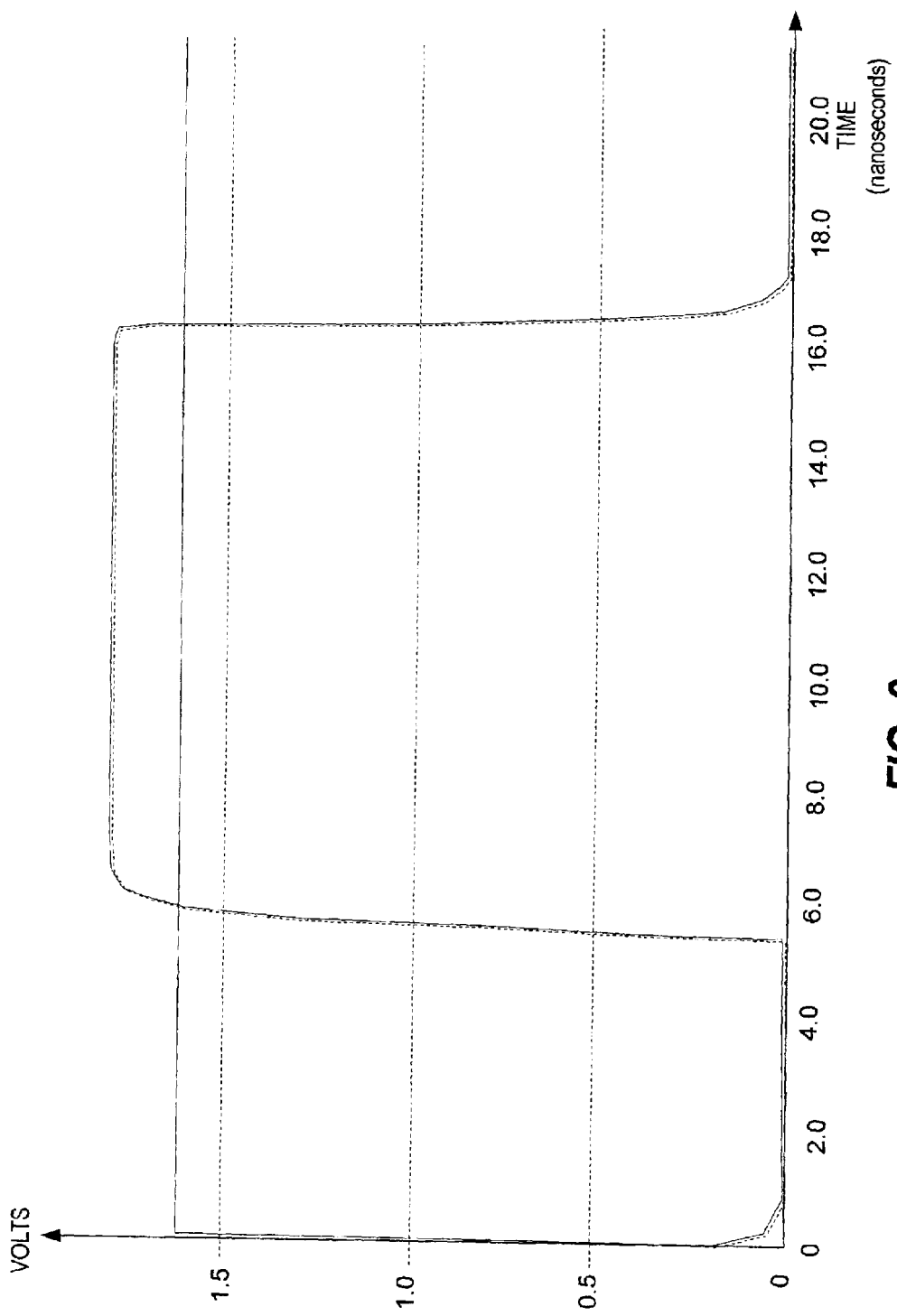
FIG. 8 is a timing diagram illustrating the clock skew between the first clock driver to receive the input clock signal and the last clock driver to receive the input clock signal for both the balanced tree branch and the unbalanced tree branch.

FIG. 8 is a timing diagram illustrating the clock skew between the first clock driver 3 145c and the last clock driver 25 145y to receive the input clock signal CLK$_{IN}$ using the capacitance value C=2.200 pF selected for implementation in the simulation shown in FIG. 7 using the method of FIG. 6. The clock skew is measured from the 50% level of the maximum signal value of one signal CLK$_3$ to the 50% level of the maximum signal value of the other signal CLK$_{25}$. As shown, the loading equivalent circuit 110 generates nearly identical timing signals as the signals CLK$_3$ and CLK$_{25}$ in the balanced tree.

While for the sake of simplicity in the illustrative example SPICE was used to sweep only the capacitance value C (with a fixed resistance value), SPICE may also be used to sweep the resistance value R.

Alternatively, the clock tree designer may choose to create Bode plots of each branch, and match parameters to determine the roll-off point of each branch.

It has been found that the capacitance values may vary by as much as 20% and still meet skew tolerance specifications. Accordingly, even if the R and C values for the loading equivalent circuit 110 vary due to manufacturing process variations, the loading equivalent circuit is still sufficiently accurate to meet specifications.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for minimizing clock skew in an integrated circuit, comprising:
   generating a balanced clock tree design, said balanced clock tree design comprising a plurality of branches each characterized by a matching load resistance and matching load capacitance;
   replacing, in said balanced clock tree design, a branch with a loading equivalent circuit, said loading equivalent circuit characterized by said matching load resistance and said matching load capacitance of said replaced branch, wherein said replacing step comprising:
   breaking a node comprising an input node to said replaced branch;
   inserting a resistor between said input node and an output node; and
   inserting a capacitor between said output node and a low voltage source.

2. A method in accordance with claim 1, wherein said loading equivalent circuit comprises a lumped resistance-capacitance circuit.

3. A method in accordance with claim 1, comprising:
   calculating said load capacitance of said replaced branch.

4. A method in accordance with claim 1, comprising:
   calculating said load resistance of said replaced branch.

5. A method in accordance with claim 1, comprising:
   calculating said load capacitance and said load resistance of said replaced branch.

6. A semi-balanced signal routing tree for an integrated circuit, comprising:
   a node of an interconnect routing tree of said integrated circuit;
   a plurality of metal routing trace branches branching from said node, wherein at least one of said branches comprises a balanced branch characterized by a load resistance and a load capacitance and at least one of said branches comprises a loading equivalent circuit characterized by said load resistance and said load capacitance of said balanced branch, wherein said loading equivalent circuit comprises:
   a resistor connected between said node and an internal branch node; and
   a capacitor connected between said internal branch node and a low voltage source.

7. A semi-balanced signal routing tree in accordance with claim 6, wherein said loading equivalent circuit comprises a lumped resistance-capacitance circuit.

8. An integrated circuit comprising a semi-balanced signal routing tree, comprising:
   circuitry which receives a predetermined signal;
   at least one signal interconnect layer for routing said predetermined signal;
   a node on said at least one interconnect layer;
   a plurality of branches comprising a plurality of metal signal routing traces for routing said predetermined signal, each branching from said node, wherein at least one of said branches comprises a balanced branch characterized by a load resistance and a load capacitance and at least one of said branches comprises a loading equivalent circuit characterized by said load resistance and said load capacitance of said balanced branch, wherein said loading equivalent circuit comprises:
   a resistor connected between said node and an internal branch node; and
   a capacitor connected between said internal branch node and a low voltage source.

9. An integrated circuit in accordance with claim 8, wherein said loading equivalent circuit comprises a lumped resistance-capacitance circuit.

10. An integrated circuit in accordance with claim 8, wherein said predetermined signal comprises a clock signal.

* * * * *